United States Patent
Karpman

(10) Patent No.: US 8,785,249 B2
(45) Date of Patent: Jul. 22, 2014

(54) THREE DIMENSIONAL MICROELECTRONIC COMPONENTS AND FABRICATION METHODS FOR SAME

(75) Inventor: Maurice Karpman, Brookline, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 99 days.

(21) Appl. No.: 13/488,804

(22) Filed: Jun. 5, 2012

(65) Prior Publication Data

US 2013/0323884 A1 Dec. 5, 2013

Related U.S. Application Data

(63) Continuation of application No. 13/478,257, filed on May 23, 2012, now abandoned.

(51) Int. Cl.
- H01L 21/00 (2006.01)
- H01L 21/78 (2006.01)
- H01L 21/56 (2006.01)

(52) U.S. Cl.
CPC .................. H01L 21/78 (2013.01); H01L 21/568 (2013.01)
USPC ........... 438/113; 438/127; 438/457; 438/459; 438/460; 257/E21.599

(58) Field of Classification Search
CPC .............................. H01L 21/78; H01L 21/568
USPC .......................... 438/113, 127, 457, 459, 460; 257/E21.599
See application file for complete search history.

(56) References Cited

U.S. PATENT DOCUMENTS

| | | | |
|---|---|---|---|
| 6,083,769 A * | 7/2000 | Kurahashi | 438/33 |
| 7,727,806 B2 * | 6/2010 | Uhland et al. | 438/109 |
| 7,960,247 B2 * | 6/2011 | Thompson et al. | 438/459 |
| 8,409,927 B1 * | 4/2013 | Yim | 438/113 |
| 2005/0208701 A1 * | 9/2005 | Jeong et al. | 438/106 |
| 2008/0143468 A1 | 6/2008 | Yokoyama et al. | |
| 2009/0001521 A1 * | 1/2009 | Yonekawa | 257/620 |
| 2009/0134490 A1 * | 5/2009 | Furukawa et al. | 257/531 |
| 2011/0063790 A1 * | 3/2011 | Park et al. | 361/679.31 |
| 2011/0133992 A1 * | 6/2011 | Suzuki | 343/700 MS |

(Continued)

OTHER PUBLICATIONS

Notification of Transmittal of the International Search Report and the Written Opinion of the International Searching Authority from corresponding PCT/US2013/042258 mailed Dec. 16, 2013.

(Continued)

Primary Examiner — Long K Tran
(74) Attorney, Agent, or Firm — Lando & Anastasi, LLP

(57) ABSTRACT

Aspects and examples include electrical components and methods of forming electrical components. In one example, a method includes selecting a substrate, forming a pattern of a first conductive material on a top surface of the substrate, forming a pattern of a second conductive material on a bottom surface of the substrate, dicing the substrate into one or more die having a first diced surface and a second diced surface, securing the first diced surface of each of the one or more die to a retaining material, encapsulating the one or more die in an encapsulent to form a reconstituted wafer, and forming a pattern of a third conductive material on the second diced surface by metalizing a surface of the reconstituted wafer.

24 Claims, 15 Drawing Sheets

(56) References Cited

U.S. PATENT DOCUMENTS

| | | |
|---|---|---|
| 2011/0170266 A1 | 7/2011 | Haensch et al. |
| 2011/0217826 A1* | 9/2011 | Sakurada .................... 438/462 |
| 2011/0234357 A1 | 9/2011 | Kim et al. |
| 2012/0094439 A1 | 4/2012 | Val |
| 2013/0078767 A1* | 3/2013 | Yim .............................. 438/113 |

OTHER PUBLICATIONS

Young et al. Monolithic High-Performance Three-Dimensional Coil Inductors for Wireless Communication Applications. IEEE. (1997). [retrieved on Oct. 18, 2013] Retrieved from the Internet: <URL: http://filer.case.edu/djy/publications/IEDM97.pdf> entire document.

* cited by examiner

ND MICROELECTRONIC COMPONENTS AND
FABRICATION METHODS FOR SAME

THREE DIMENSIONAL MICROELECTRONIC COMPONENTS AND FABRICATION METHODS FOR SAME

CROSS-REFERENCE TO RELATED APPLICATIONS

This application is a continuation under 35 U.S.C. §120 of U.S. application Ser. No. 13/478,257, titled "THREE DIMENSIONAL MICROELECTRONIC COMPONENTS AND FABRICATION METHODS FOR SAME," filed on May 23, 2012, which is incorporated herein by reference in its entirety.

BACKGROUND

Conventional microelectronics fabrication techniques often involve the fabrication of devices, for example microprocessors, on a semiconductor substrate by the selective doping of regions of the substrate and deposition and patterning of various layers of dielectric, metals, and semiconductor materials. These layers of materials are often very thin, on the order of microns. The resulting devices are effectively two dimensional. Providing additional functionality, for example, by the addition of additional transistors or other features to a device, conventionally requires the surface area of the device to be increased, subsequently reducing the number of devices that can be formed on a single wafer or included within a package of a given size.

SUMMARY

Aspects and embodiments of the present invention are directed generally to structures used in the fabrication of microelectronic circuits such as integrated circuits, multi-chip modules, and multi-layer high density multi-component modules.

In accordance with an aspect of the present invention there is provided a method of forming an electrical component. The method comprises selecting a substrate, forming a pattern of a first conductive material on a top surface of the substrate, forming a pattern of a second conductive material on one of a bottom surface of the substrate and a dielectric layer formed over the pattern of the first conductive material, dicing the substrate into plurality of dies each having a first diced surface and a second diced surface, securing the first diced surface of each of the plurality of dies to a retaining material, encapsulating the plurality of dies in an encapsulent to form a reconstituted wafer, and forming a pattern of a third conductive material on the second diced surfaces by metalizing a surface of the reconstituted wafer.

In accordance with some embodiments each of the first conductive material, the second conductive material, and the third conductive materials comprise a metal.

In accordance with some embodiments forming the pattern of a first conductive material on the top surface of the substrate comprises forming a first plurality of metal lines on the top surface of the substrate In accordance with some embodiments forming the pattern of the second conductive material on the bottom surface of the substrate comprises forming a second plurality of metal lines on the bottom surface of the substrate.

In accordance with some embodiments forming the second plurality of metal lines on the bottom surface of the substrate comprises forming the second plurality of metal lines at positions horizontally displaced from the first plurality of metal lines on the top surface of the substrate.

In accordance with some embodiments selecting a substrate comprises selecting a substrate comprising a ferrite material.

In accordance with some embodiments the method further comprises forming a pattern of a fourth conductive material on the first diced surfaces.

In accordance with some embodiments the method further comprises thinning the reconstituted wafer prior to one of forming the pattern of the third conductive material on the second diced surface and forming the pattern of the fourth conductive material on the first diced surface.

In accordance with some embodiments forming the pattern of the third conductive material on the second diced surface electrically connects a first metal line on the top side of the substrate to a second metal line on the bottom side of the substrate.

In accordance with some embodiments forming the pattern of the fourth conductive material on the first diced surface electrically connects a fourth metal line on the top side of the substrate to the second metal line on the bottom side of the substrate.

In accordance with some embodiments the electrical component formed comprises an inductor.

In accordance with some embodiments selecting a substrate comprises selecting a substrate comprising an insulating material.

In accordance with some embodiments the method further comprises forming one or more bond pads in electrical communication with one or more of the first plurality of metal lines on an upper side of the reconstituted wafer.

In accordance with some embodiments the method further comprises forming one or more bond pads in electrical communication with one or more of the first plurality of metal lines on a lower side of the reconstituted wafer.

In accordance with some embodiments the method further comprises thinning the reconstituted wafer prior to one of forming the one or more bond pads on the upper side of the reconstituted wafer and forming the one or more bond pads on the lower side of the reconstituted wafer.

In accordance with some embodiments the method further comprises incorporating the electrical component into an electronic module, one of the first plurality of metal lines configured as a through wafer via in the electronic module and electrically connecting a second electronic component in the electronic module to the one of the first plurality of metal lines.

In accordance with some embodiments the one or more of the first plurality of metal lines have a length in a direction normal to the first diced surface of greater than about 1 mm.

In accordance with some embodiments the one or more of the first plurality of metal lines have a length which is greater than about 15 times a thickness of the one or more of the first plurality of metal lines and about 15 times a width of the one or more of the first plurality of metal lines.

In accordance with another aspect of the present invention there is provided a method of forming an electrical component. The method comprises forming a first pattern of metal lines on a top surface of a substrate, each of the metal lines in the first pattern having a length, forming a second pattern of a metal lines on one of a bottom surface of the substrate and a dielectric layer formed over the pattern of the first conductive material, the metal lines in the second pattern parallel to the metal lines in the first pattern, dicing the substrate into one or more die having a first diced surface and a second diced surface, and forming a third pattern of metal on the first diced surface.

In accordance with some embodiments forming the second pattern of a metal lines comprises forming the second pattern of a metal lines horizontally displaced from the metal lines in the first pattern in a direction normal to a direction defined by the length of a metal line in the first pattern of metal lines and in a plane parallel to the bottom surface of the substrate.

In accordance with some embodiments forming the third pattern of metal comprises forming a third pattern of metal lines.

In accordance with some embodiments the method further comprises forming a fourth pattern of metal lines on the second diced surface.

In accordance with some embodiments the method further comprises electrically connecting a metal line in the first pattern of metal lines and a metal line in the second pattern of metal lines with a metal line in one of the third pattern of metal lines and the fourth pattern of metal lines.

In accordance with another aspect of the present invention there is provided a method of forming an electrical component. The method comprises selecting a substrate, forming a layer of first sacrificial material on a top surface of the substrate, forming a pattern of a first conductive material on a top surface of the layer of the first sacrificial material, forming a layer of second sacrificial material on a top surface of the pattern of the first conductive material, forming a pattern of a second conductive material on a top surface of the layer of the second sacrificial material, forming an end structure physically joined to at least a portion of the pattern of the first conductive material and to at least a portion of the pattern of the second conductive material; removing the substrate and the layer of the first sacrificial material from the pattern of the first conductive material, embedding the pattern of the first conductive material and the pattern of the second conductive material in one of a reconstituted wafer and a multi-chip module, and removing the end structure from the embedded pattern of the first conductive material and pattern of the second conductive material.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
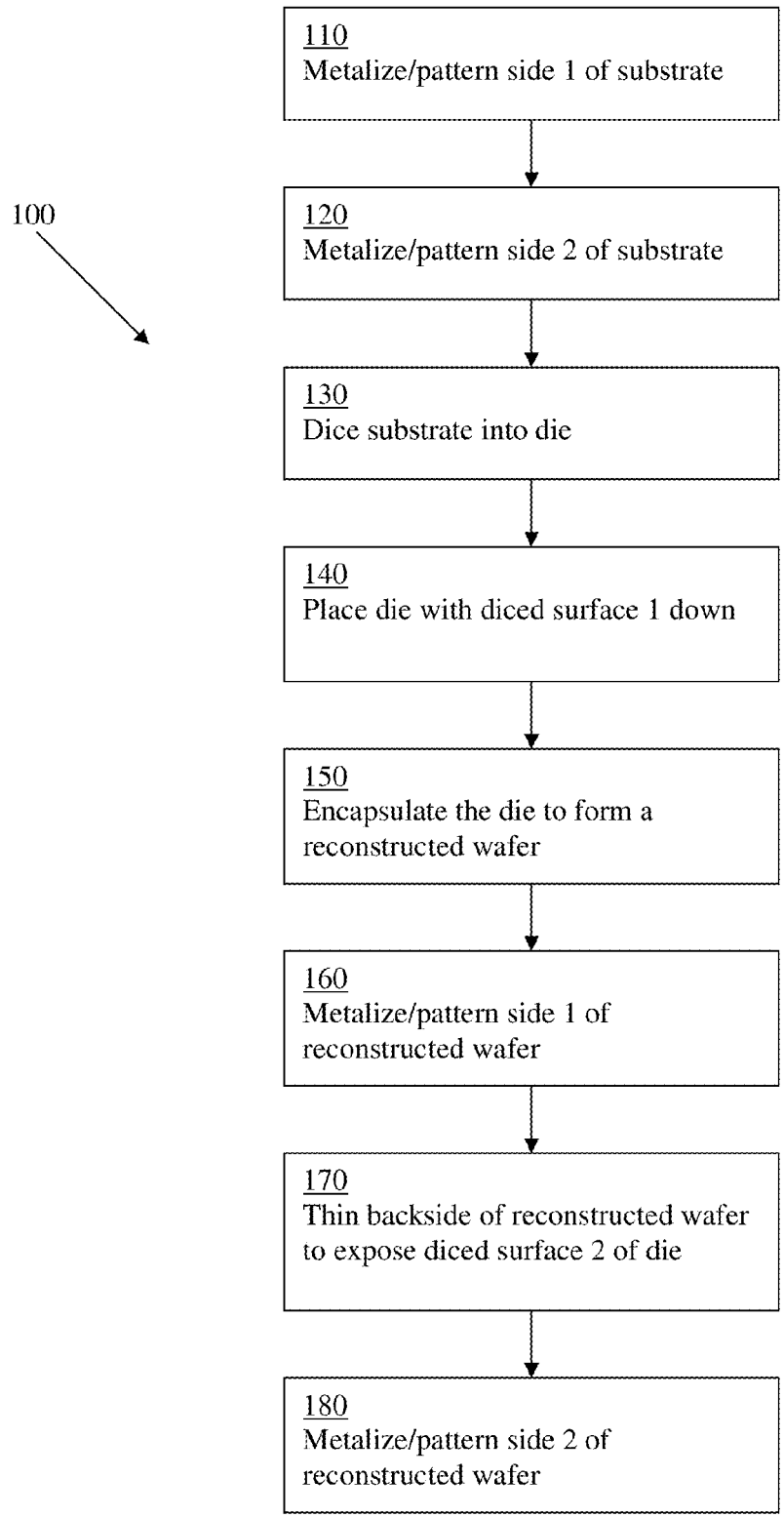
FIG. 1 is a flow chart of one example of a method in accordance with aspects of the present invention.

Conventionally, electronic circuits are fabricated using methods that include the stacking of planar layers of patterned metal. These planar layers of patterned metal are typically formed parallel to the surface of a substrate upon which the electronic circuit is formed (referred to herein as "horizontal" layers.) For some applications, however, it is desirable to provide patterned metal layers that are perpendicular to the surface of the substrate on which the electronic circuit is formed (referred to herein as being "vertical structures.") These vertical layers may be used to provide, for example, vias for connecting features on one side of the substrate to features on a second side of a substrate (referred to herein as "through substrate vias" or "TSVs") or to form three dimensional structures such as inductors. Various previously known methods for attempting to form functional vertical metal structures in an electronic device, including laser structuring of blanket metal coated substrates or soldering together discrete substrates, exhibit limitations regarding, for example, achievable feature size, minimum component size, and compatible metals. None of these methods are capable of producing TSVs that are substantially thicker in a direction normal to a surface of a substrate in which they are embedded than about 400 µm due to limitations of the processes. For some applications it is desirable to have TSVs formed in die or substrates that are 1,000 µm or more in thickness in a direction normal to a surface of a substrate in which they are embedded.

It has thus been found desirable to have a process that uses conventional planar processes to produce three dimensional patterned metallization which is capable of producing vertical metallization features with feature thicknesses equal or greater than possible with previously known processes.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

Figure 2:
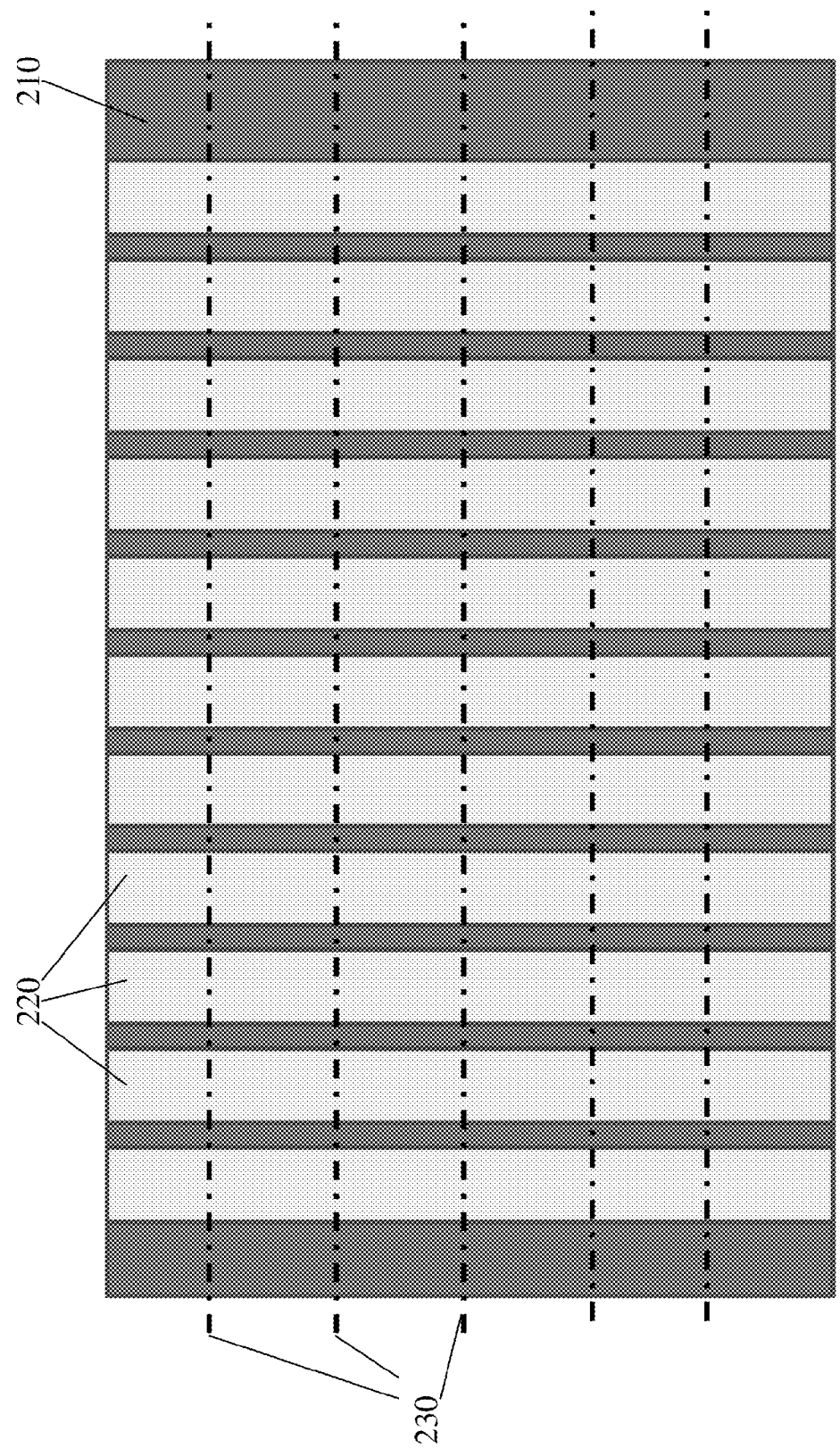
FIG. 2 is a plan view of one example of a portion of a substrate in accordance with aspects of the present invention.

A generalized process in accordance with various aspects and embodiments is illustrated generally at 100 in FIG. 1. Prior to beginning the method a substrate 210, a section of which is illustrated in FIG. 2, upon which the method is to be performed is provided or obtained. This substrate may be a conventional semiconductor wafer, for example, a wafer of silicon (Si), germanium (Ge), gallium arsenide (GaAs) or one or more other semiconductors. The substrate may in some embodiments be an electrical insulator and may comprise a dielectric such as silicon dioxide (glass) or sapphire, and in other embodiments may be a ferrite material. Non-limiting examples of ferrite materials from which the substrate may be formed include manganese-zinc ferrites (MnZn, with a formula $Mn_aZn_{(1-a)}Fe_2O_4 0 \le a \le 1$), nickel-zinc ferrites (NiZn, with a formula $Ni_aZn_{(1-a)}Fe_2O_4 0 \le a \le 1$), magnesium spinels, a nickel spinel such as Trans-Tech TT2-111 (available from Trans-Tech, Inc., Adamstown, Md.,) a barium ferrite, a zinc ferrite, an iron ferrite, $Ba_3Co_2Fe_{24}O_{41}$, or other ferrite materials which may be selected based on their electric and/or magnetic properties.

In first step 110 of the method, a top side 240 of the substrate is metalized and patterned to form a metal pattern on the substrate, for example a series of metal lines 220 (also referred to herein as metal traces) as shown in FIG. 2. These metal lines 220 may be formed by any conventional method of deposition and patterning of metal on a substrate known in the art. These methods may include, for example, metal deposition by one or more of sputtering, electroless plating, evaporative deposition, chemical vapor deposition, laser deposition, firing from an ink or paste formulation where the ink or paste is deposited by a needle dispense, screen-printing, immersion or dip coating, or electroplating, and patterning by one or more well known methods of photolithography and/or chemical etching. The metal lines 220 may comprise copper, aluminum, or any other metal or conductive material. One or more non-metallic materials may also or additionally be used to form the conductive lines 220, although for the sake of simplicity, the lines 220 are referred to herein as "metal lines." One or more adhesion layers, for example, a layer of titanium may be provided to facilitate adhesion of the metal lines 220 to the substrate 210. The metal lines may have dimensions of, for example, between about 20 µm and about 50 µm across, although embodiments of the present invention are not limited to any particular dimensions of the metal lines 220.

A portion of the metal lines 220 (which may be a "seed portion" for electroplating) may be formed by physical deposition, for example, sputtering or evaporation, and a remaining portion may be formed by electroplating. The physically deposited portion of metal lines 220 may include, for example, approximately 200 nm of copper over approximately 100 nm of titanium, and the electroplated portion may comprise or consist essentially of from about 3 µm to about 25 µm of copper or another metal as measured in a direction normal to a plane defined by the surface of the substrate on which they are deposited. These dimensions are exemplary only, and embodiments of the present invention are not limited to any particular dimensions for the metal lines 220. In another embodiment, substantially all of the metal lines 220 are formed by physical deposition. In some embodiments, the metal lines 220 may be sintered, thus reacting with the material of the substrate 210 to convert at least a portion of substrate 210 into a conductive alloy (for example, a metal silicide.)

In step 120, the bottom side 250 of the substrate 210 is metalized and patterned to form a metal pattern on the substrate, for example a series of metal lines similar to metal lines 220 shown in FIG. 2. In some embodiments, the metal lines 220 formed on the top side 240 of the substrate are offset from the metal lines formed on the bottom side 250 of the substrate, for example horizontally offset in a direction normal to a direction defined by the length of the metal lines and in the plane parallel to the top and/or bottom side 240, 250 of the substrate. The metal lines on the bottom side 250 of the substrate 210 may comprise the same or similar materials as those formed on the top side 240 of the substrate 210 or may comprise one or more different or additional materials. The metal lines on the bottom side 250 of the substrate 210 may be formed in a similar method as those formed on the top side 240 of the substrate 210 or may be formed by a different method.

Figure 3:
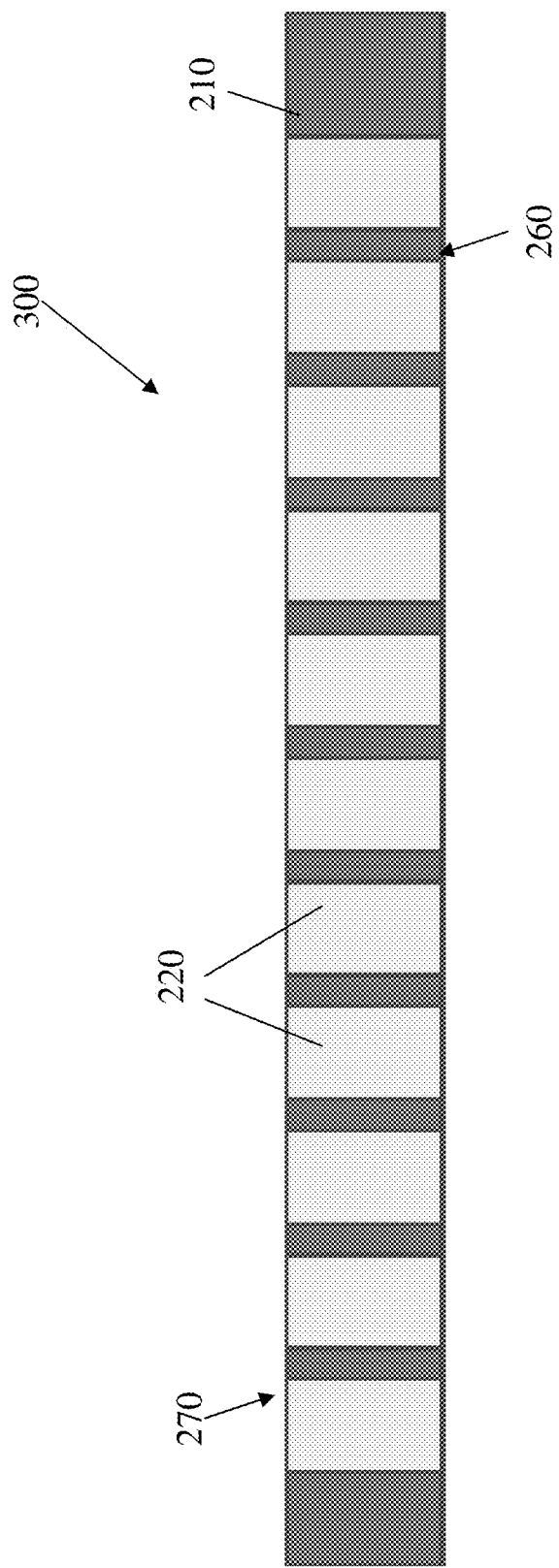
FIG. 3 is a plan view one example of a portion of a die formed from the portion of the substrate of FIG. 2 in accordance with aspects of the present invention.
Figure 4:
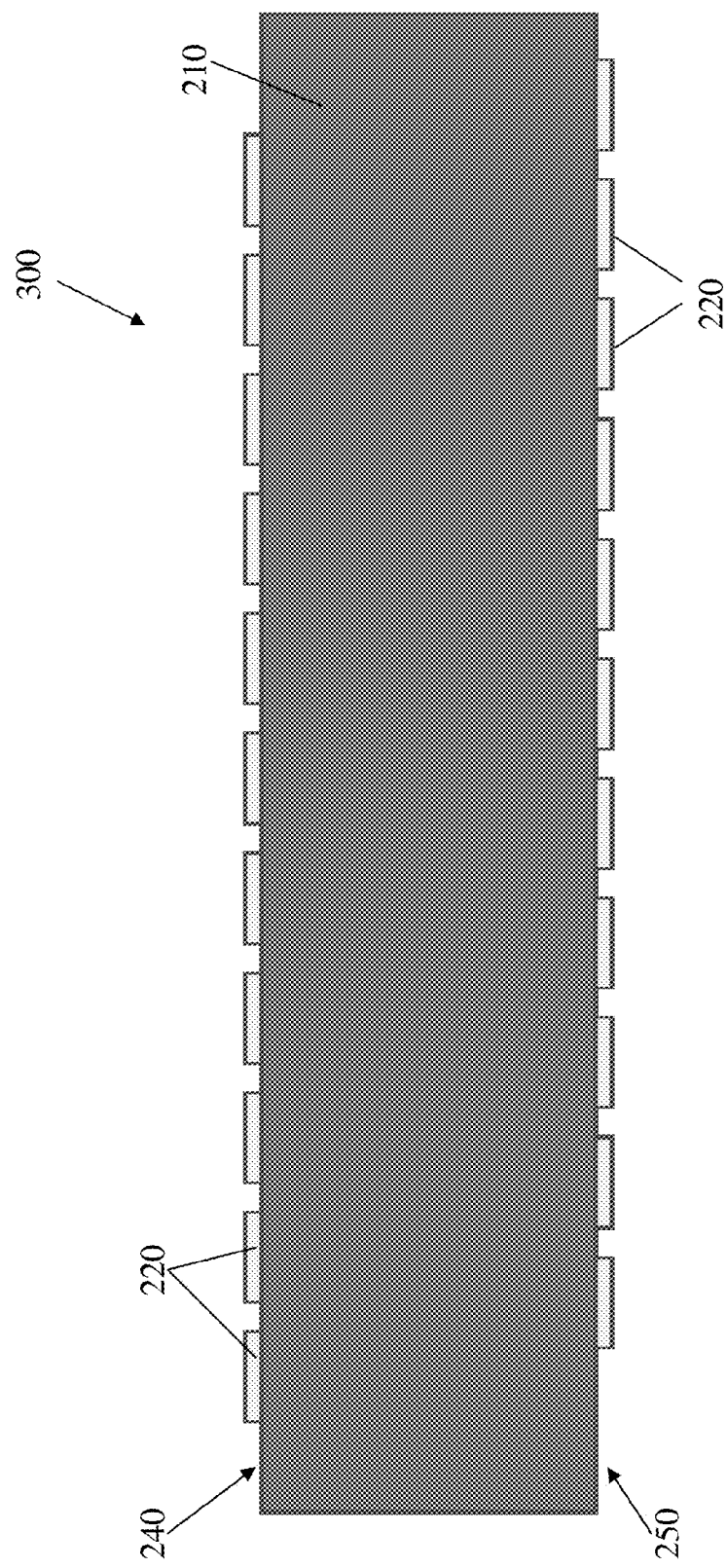
FIG. 4 is an elevational view of the portion of the die of FIG. 3 illustrating a plurality of conductive features formed thereon.

In step 130 the substrate 120 is diced into individual die 300. The substrate may, for example, be sawed or cleaved along lines such as those indicated at 230 in FIG. 2. The individual die will have first sides 260 and second sides 270 formed by the dicing operation. An embodiment of a die formed in this step is illustrated in a plan view in FIG. 3, and in an elevational view from the side in FIG. 4. As can be seen in FIG. 4, the metal lines 220 on the top side 240 side of the substrate may be horizontally offset from the metal lines on the bottom side 250 of the substrate 210. The individual die may have dimensions of, for example, about 0.5 mm in length, from about 10 µm to about 20 µm in thickness, and from about 150 µm to about 1,000 µm in width, although embodiments of the present invention are not limited to any particular dimensions of the die 300.

Figure 5:
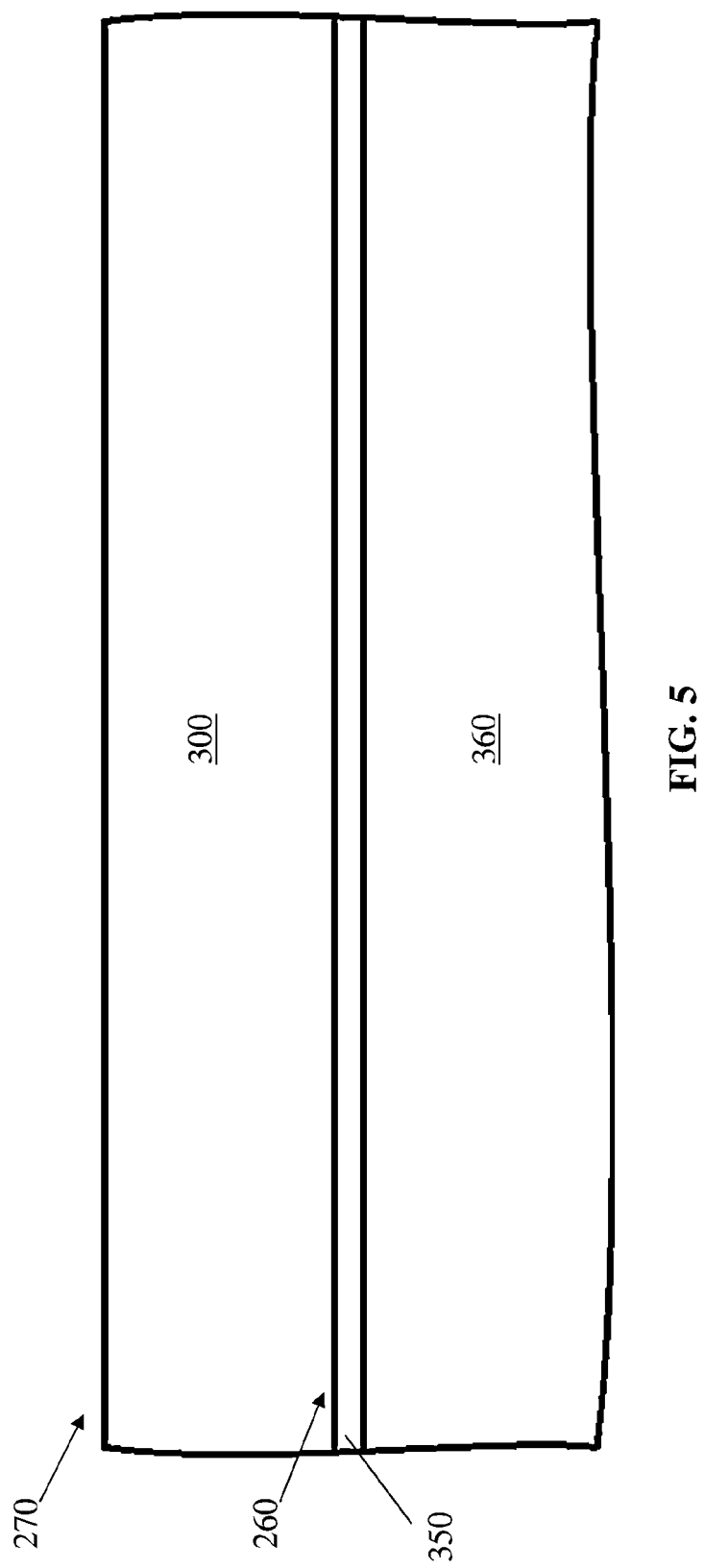
FIG. 5 is a cross section of the die of FIG. 3 adhered to one example of a handling wafer in accordance with aspects of the present invention.

In step 140, the individual die 300 are arranged and placed with the first sides 260 (or alternatively, the second sides 270) face down onto a retaining material 350, for example, a liquid adhesive such as a glue, a solid adhesive such as a tape adhesive, or an adhesive film to hold the die in position relative to one another. The adhesive film may be mounted on a rigid material, for example, a handling wafer 360 formed of a dielectric, a semiconductor (Si, Ge, GaAs, etc.), ferrite, metal, or other type of material as is illustrated in FIG. 5, where the metal lines 220 have been omitted for clarity. The adhesive film 350 may comprise a material such as Mylar® polyester sheeting, or one or more other adhesive films known in the art. In some embodiments the adhesive film may be omitted, and the individual die 300 may be placed directly onto a dielectric material as the retaining material. The dielectric material may be the handling wafer 360 or a film, for example, glass, formed on the handling wafer 360. The dielectric material may be exposed to a high temperature to soften a surface of the dielectric material such that as each individual die 300 is placed in a desired location it adheres to the dielectric material. The dielectric material may then be cooled so that the individual die 300 are fixed in place on the dielectric material relative to each other. In some embodiments, the die may be adhered to the retaining material 350 utilizing one or more methods such as described in U.S. Pat. No. 7,960,247, titled "DIE THINNING PROCESS AND STRUCTURES," which is assigned to the assignee of the present application and is incorporated herein by reference for all purposes.

Once adhered to the retaining material, the sides of the individual die 300 not adhered to the retaining material, for example, the second sides 270, may be substantially co-planar, for example, planar to within about ±2 µm or less relative to the second sides 270 of the other individual die 300.

Figure 6:
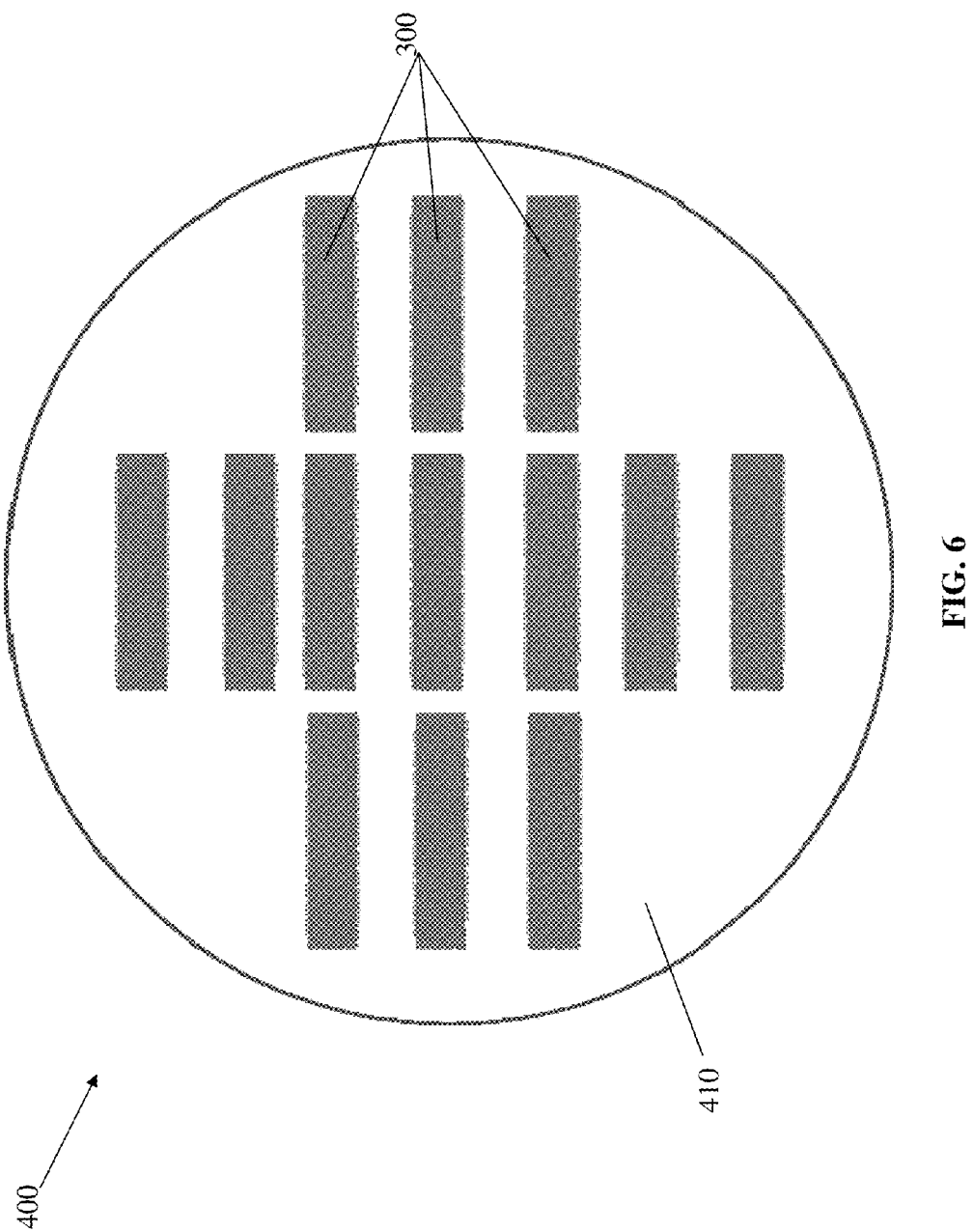
FIG. 6 is a plan view of one example of a reconstituted wafer in accordance with aspects of the present invention.

In step 150 a reconstructed wafer 400, illustrated in FIG. 6, may be formed by encapsulating the die 300 mounted to the retaining layer in an encapsulent 410. The encapsulent 410 may comprise a polymeric material that may be filled or unfilled. The encapsulent may comprise a thermoplastic material that can be flowed over or around the die, soft baked to be solid but pliable on heating, planarized, and then hard baked to increase the stiffness of the material. The encapsulent 410 may comprise, for example, a filled polymer such as molding epoxy. The filler may reduce the thermal expansion of the polymer, and may include minerals, for example, quartz, in the form of particles. The particles may be in the form of, for example, spheres, and may have characteristic dimensions, for example, diameters, smaller than approximately 50 µm. The particles, however are not limited to being sphereical and may be plate-like or oblong in some embodiments. The encapsulant 410 may be an insulating material having a coefficient of thermal expansion (CTE) approximately equal to the CTE of silicon. In some embodiments, the encapsulant 410 may comprise a heavily filled material such as an epoxy molding compound available from Shin-Etsu Chemical Co, LTD, Tokyo Japan.

The encapsulent may comprise materials and be deposited in methods such as described for the encapsulation layer 1105 described in U.S. Pat. No. 7,727,806, titled "SYSTEMS AND METHODS FOR HIGH DENSITY MULTI-COMPONENT MODULES," which is assigned to the assignee of the present application and is incorporated herein by reference for all purposes.

The encapsulent 410 may be applied to the die 300 on the retaining material in a mold such that the resultant reconstructed wafer 400 has desired dimensions and shape when solidified. The reconstructed wafer 400 may be, for example, substantially or completely circular with a diameter similar or equal to that of a standard sized semiconductor wafer, for example, about 100 mm, about 150 mm, or about 200 mm in diameter.

Figure 7:
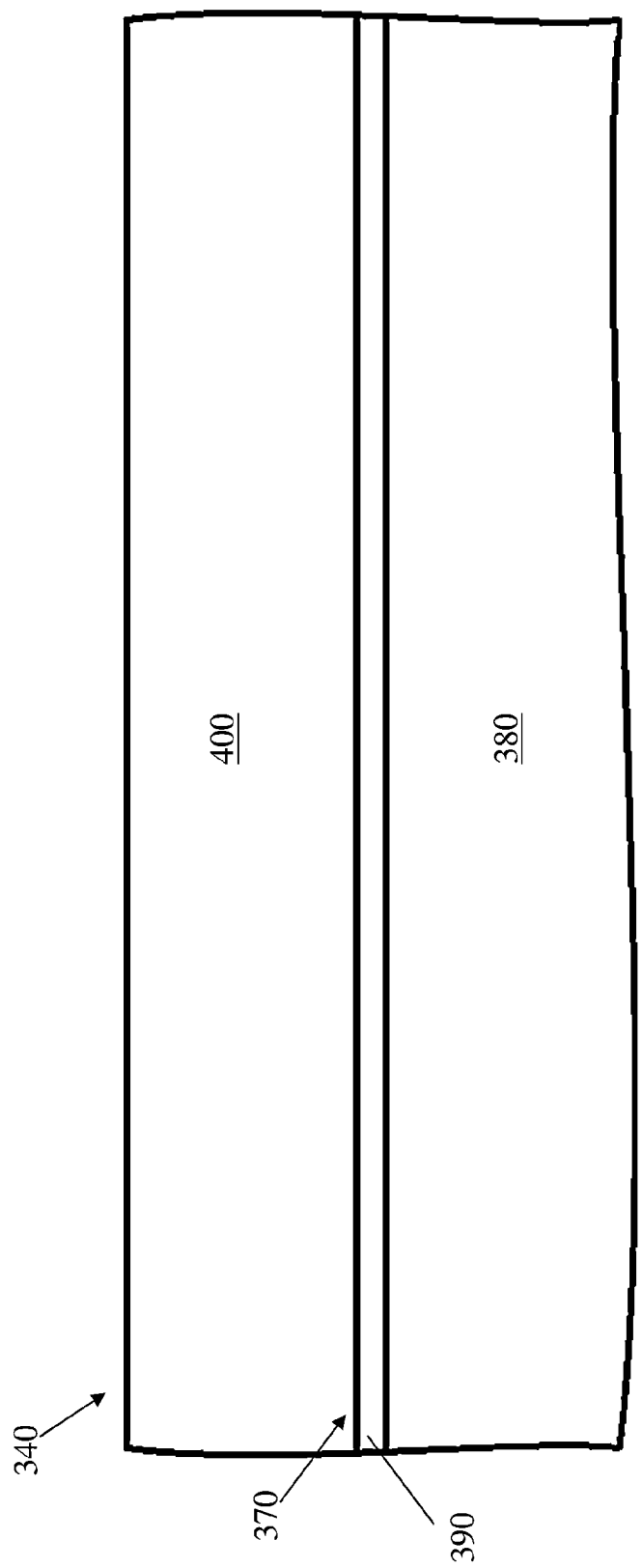
FIG. 7 is a cross section of the reconstituted wafer of FIG. 6 adhered to one example of a handling wafer in accordance with aspects of the present invention.

The retaining material 350 may then be removed from the reconstructed wafer, resulting in the surfaces of the first sides 260 (or alternatively, the second sides 270) of the die 300 which were adhered to the retaining material being substantially coplanar, for example planar to within about ±2 µm or less with the surface of the reconstructed wafer 400 formed from the encapsulent which had solidified adjacent the retaining material. A handling wafer 380 may then be bonded to a surface of the reconstructed wafer 400 using a bonding material 390 such as WaferBOND® HT-10.10 temporary bonding material available from Brewer Science, Inc., Rolla, Mo. (FIG. 7) to provide the reconstructed wafer with sufficient mechanical stability to withstand the remaining processing steps. The handling wafer 380 may comprise a wafer of glass or of a semiconductor material, for example, silicon or any other material providing a desired degree of mechanical strength. In some embodiments, where the retaining material to which the individual die were adhered to in act 140 was mounted on or comprised a handling wafer 360 formed from, for example, glass or a semiconductor material, the retaining material and handling wafer 360 may be used instead of or in addition to the handling wafer 380.

The reconstructed wafer 400 may undergo a thinning process to expose the surfaces of the first sides 260 (or alternatively, the second sides 270) of the die which may have been covered with encapsulent and/or to planarize the surfaces of the first sides 260. The thinning process may comprise mechanical grinding or lapping, for example, on a copper lapping plate, with a polishing slurry, for example, diamond particles suspended in a liquid such as water. In some embodiments, exposed surfaces of the first sides 260 of the thinned die 300 are further smoothed by, for example, chemical-mechanical polishing.

Figure 8:
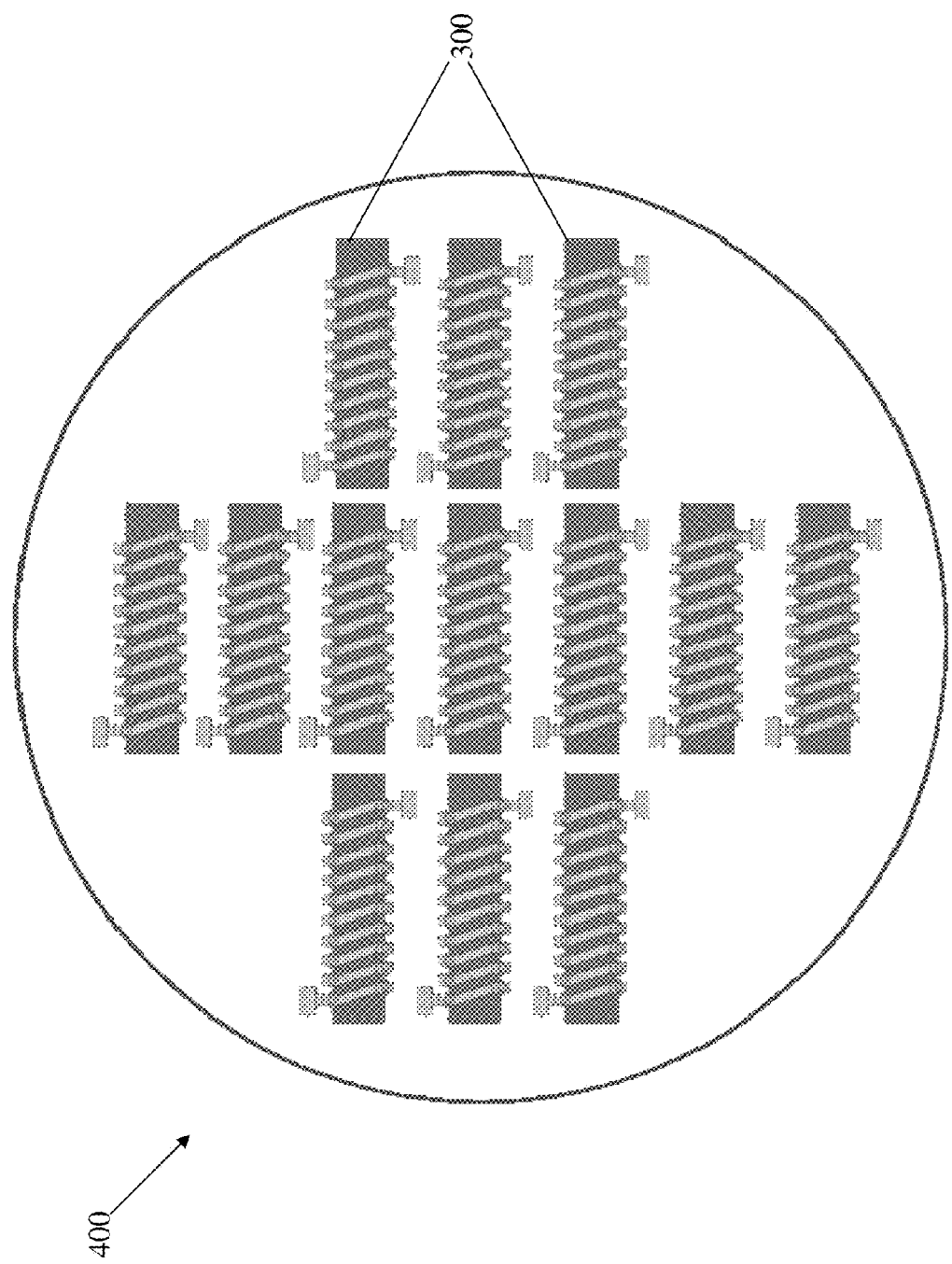
FIG. 8 is a plan view of the reconstituted wafer of FIG. 6 including examples of a plurality of die including examples of inductors in accordance with aspects of the present invention.
Figure 9:
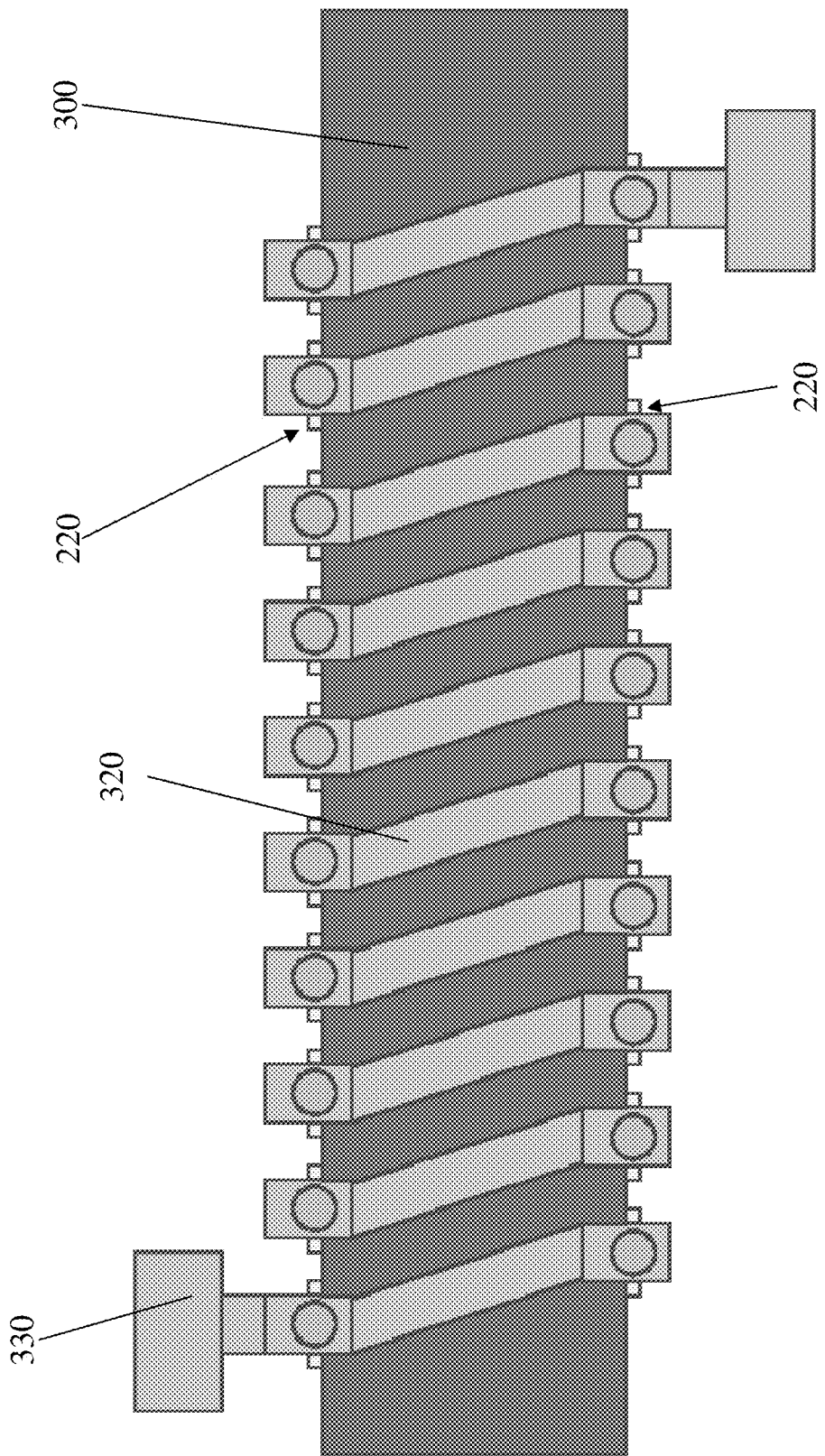
FIG. 9 is a plan view of one example of an inductor in accordance with aspects of the present invention.
Figure 10:
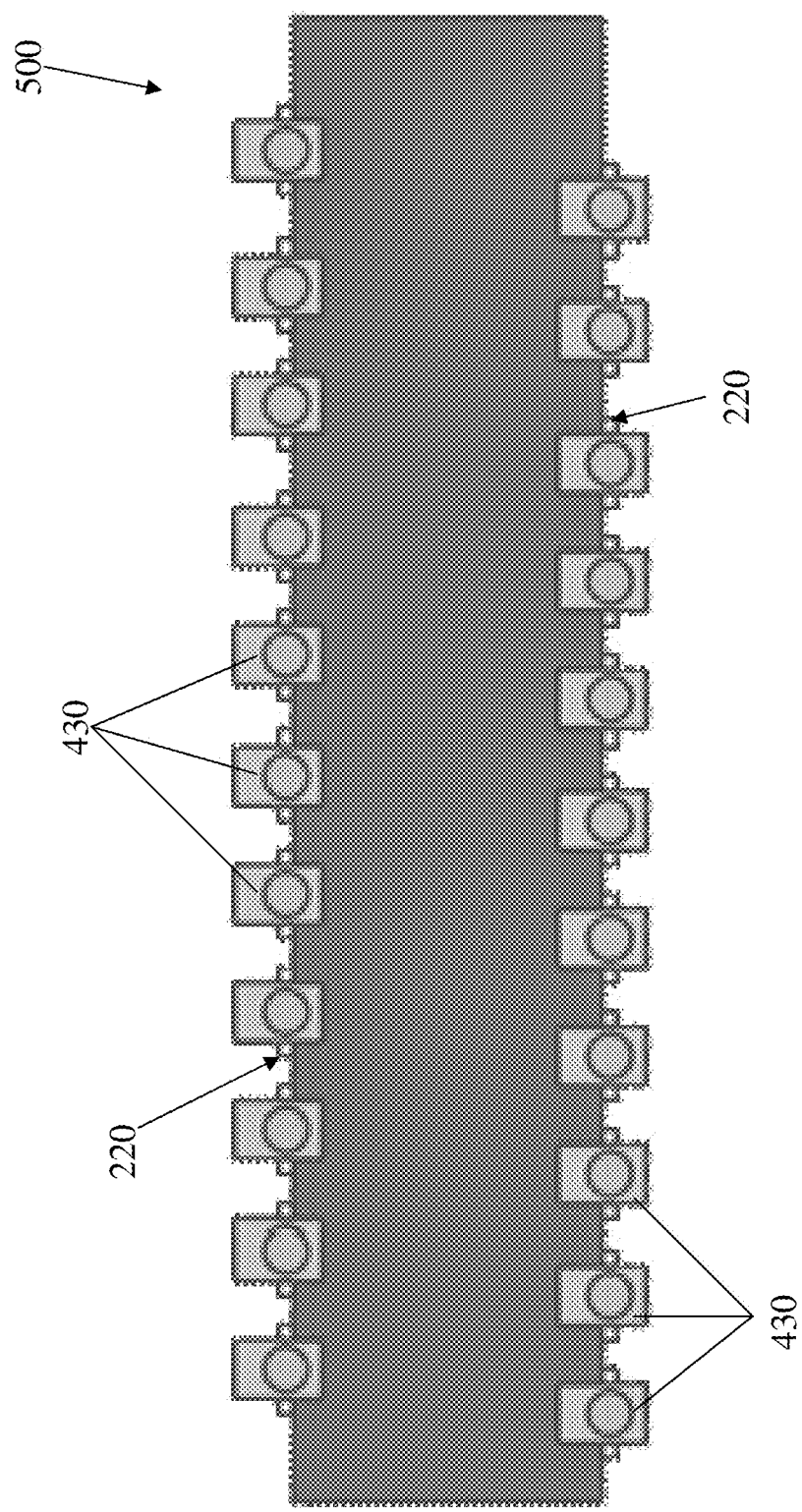
FIG. 10 is a plan view of one example of a through substrate via die in accordance with aspects of the present invention.

After exposing, and optionally polishing a first set of surfaces, for example, surfaces of the first sides 260 (or alternatively, the second sides 270) of the die 300, these surfaces are metalized (step 160 of FIG. 1.) The metallization may include forming metal lines 320, as illustrated in FIG. 8. As illustrated in an expanded view in FIG. 9, the metal lines 320 may electrically connect the metal lines 220 which were formed on the top and bottom sides 240, 250 of the die 300 in steps 110 and 120 of FIG. 1. The metal lines 320 may be formed in a similar manner and of a similar material or materials as the metal lines 220 or may be formed in a different manner or from a different material or materials. Bond pads 330 may be formed concurrently with and from a similar material or materials as the metal lines 320 or may be formed in a different set of processing acts.

After the metal lines 320 are formed on the surface of the first sides 260 (or alternatively, the second sides 270) of the die 300, the handling wafer 360, 380 may be removed from the reconstructed wafer using methods known in the art, such as by dissolution of the bonding material with a solvent or by heating to soften the bonding material. Another handling wafer, which in some embodiments may be the same handling wafer 360, 380 previously used, may be attached to the reconstructed wafer over the metal lines 320 on an upper side 340 of the reconstructed wafer using a bonding material such as WaferBOND® HT-10.10 temporary bonding material. The surfaces of the second sides 270 (or alternatively, first sides 260) of the die 300 may then be exposed on the lower side 360 of the reconstructed wafer by thinning the reconstructed wafer (step 170 of FIG. 1.) The thinning process may comprise mechanical grinding or lapping, for example, on a copper lapping plate, with a polishing slurry, for example, diamond particles suspended in a liquid such as water. In some embodiments, exposed surfaces of the second sides 270 of the thinned die 300 are further smoothed by, for example, chemical-mechanical polishing in a similar manner as were the surfaces of the first sides 260. Metal lines (not shown), which may be similar to metal lines 320 may then be formed on the surfaces of the second sides 270 of the die 300 (step 180 of FIG. 1.) The metal lines formed on the second sides 270 of the die 300 may be formed of a similar material or materials as the metal lines 320 and may be formed in a similar manner as the metal lines 320. The metal lines formed on the second sides 270 of the die 300 may electrically connect the metal lines 220 which were formed on the top and bottom sides 240, 250 of the die 300 in acts 110 and 120 of FIG. 1 on the second sides 270 of the die. Bond pads may be formed on the lower side 360 of the reconstructed wafer of a similar material or materials and in a similar manner as bond pads 330. In some embodiments bond pads are only formed on one side of the reconstituted wafer.

The resulting structures comprising the substrate 210 and metal lines 220 and 320 may comprise a spiral, helix, or coil formed from the metal lines about the diced substrate 210. These structures may function as inductors. These inductors may have a higher capacity for energy storage with lower resistive losses and lower capacitive losses due to coupling between the traces than conventionally formed inductors due to the high density of thick flat metal traces formed thereon. The inductance of the inductors so formed may be determined by the width, spacing, and number of the metal lines 220, 320, and by the dimensions and material or materials of the substrate. A non-limiting range for the inductance of inductors formed in accordance with this method may be from about 1 nH to about 1 µH, although inductors having inductances falling outside this range may also be formed in accordance with embodiments of the presently disclosed method.

The reconstituted wafer may be diced into sections including one or more of the inductors. In some embodiments, the encapsulent may be removed by methods such as heating, dissolving in a solvent, or by other chemical or physical methods that may depend on the type of encapsulent used. These sections may be incorporated as dicrete elements in electronic modules, or may be incorporated into another reconstituted wafer with additional components to form multiple electronic modules from a reconstituted wafer. The electronic modules so formed may comprise, for example, components for communication, such as wireless communication or optical communication. The components may include radio frequency transmitters and/or radio frequency receivers. More generally, they may include radio frequency integrated circuits, or microwave integrated circuits. Additionally, or alternatively, the components may include optical signal processors including optical signal transmitters, such as light emitting diodes (LEDs), tunable diodes, or lasers, and optical signal receivers, such as photodiodes.

In some embodiments, the components may include sensors, such as mechanical sensors, thermal sensors, optical sensors, electrical sensors, and/or chemical sensors. The chemical sensors may be in fluid communication with external fluid samples via microfluidic channels for chemical sensing and analysis. Other exemplary sensors include accelerometers, tilt sensors, and gyroscopes.

The components may include transducers, such as actuators. Exemplary actuators include mechanical actuators, thermal actuators, optical actuators, electrical actuators, chemical actuators, and fluidic actuators. The transducers may also include motors, pistons, relays, microphones, piezoelectric devices, batteries, and/or fuel cells.

Although many of the possible component types mentioned above are active components, they may also be passive components. For example, the components may include inductors, capacitors, and/or resistors.

In another aspect of the present invention, a similar method such as described above may be used to form TSVs for inclusion in an electronic module. Multiple TSVs may be formed on a die 500 as illustrated in plan view in FIG. 9. Embodiments of methods for forming TSVs may be similar to that illustrated in FIG. 1 and described above for forming inductors, with a modification to steps 160 and/or 180. Instead of forming metal lines 320 which electrically connect one or more of the metal lines 220 on either or both of top and bottom sides 240, 250 of the die and/or forming bond pads 330, bond pads 430, illustrated in FIG. 9 may be formed on one or both sides 340, 370 of the reconstituted wafer. These bond pads 430 may make electrical connection with and substantially overly portions of one or more of the metal lines 220 on one or both of the top and/or bottom sides 240, 250 of the die. In various embodiments, the bond pads 430 are not limited to the shapes or locations illustrated in FIG. 9. In different embodiments the bond pads 430 may be larger or smaller or may be positioned differently, for example, one or more of the bond pads 430 may be positioned at a location not overlying a metal line 220, but electrically connected to the metal line 220 by an additional conductor or metal trace.

A reconstituted wafer including the TSV die 500 may be diced into sections including one or more of the TSV die. These sections may be incorporated into another reconstituted wafer or multi-layer module with additional components to form an electrical device such as described above with reference to the inductors. In some embodiments, the encapsulent may be removed by methods such as heating, dissolving in a solvent, or by other chemical or physical methods that may depend on the type of encapsulent used prior to placing the TSV die in an electrical device or module.

The TSV die formed in accordance with embodiments of the method described herein may have TSVs with aspect ratios significantly greater than may be achieved using conventionally known processes. For example, the TSVs may have aspect ratios of about 10:1 (length:width and/or thickness) or greater, of about 15:1 (length:width and/or thickness) or greater, or of about 25:1 (length:width and/or thickness) or greater.

Figure 11:
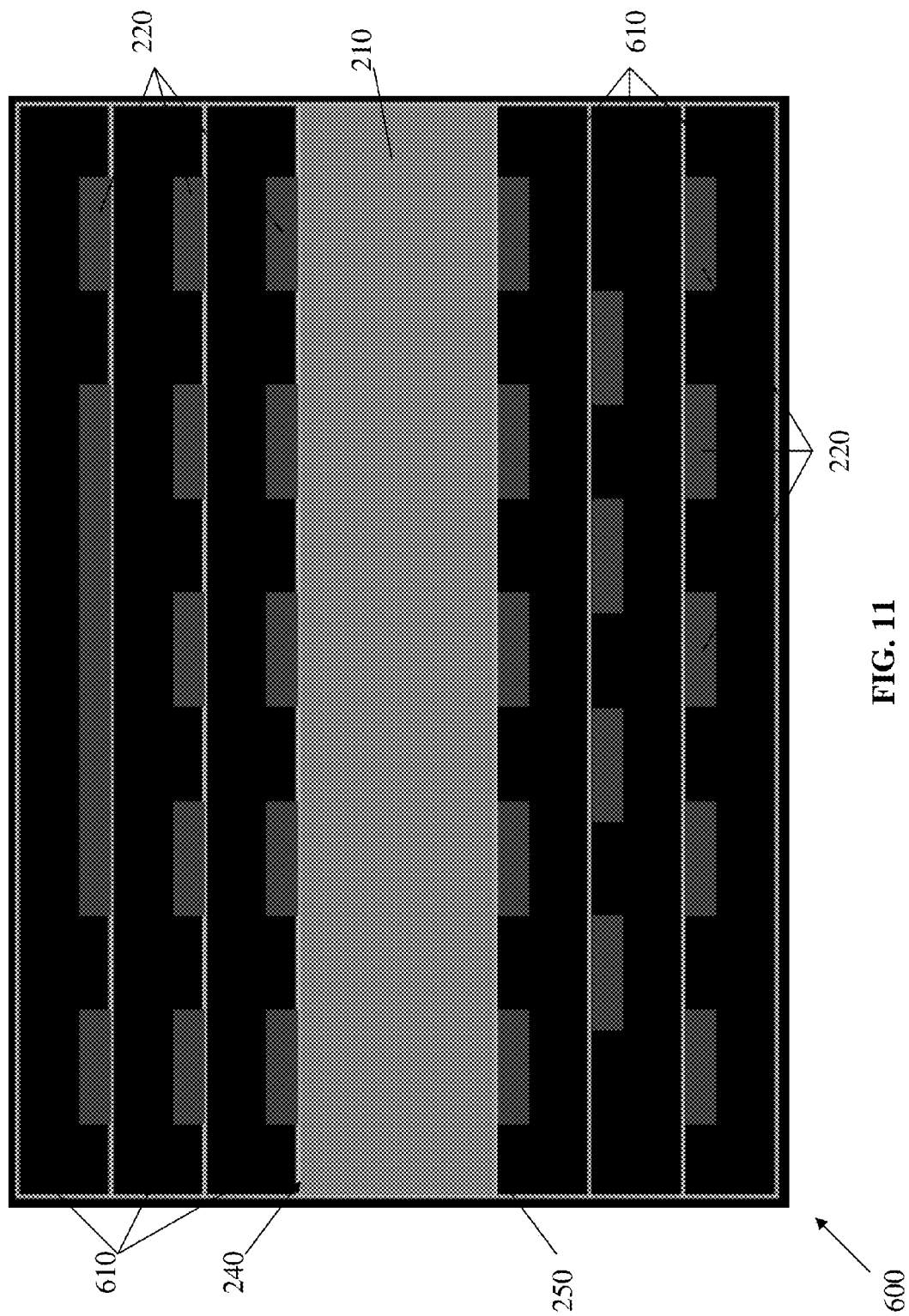
FIG. 11 is a plan view of one example of a through substrate via die in accordance with aspects of the present invention.

In another aspect of the present invention, the method illustrated in FIG. 1 may be modified such that in steps 110 and/or 120, multiple layers of metallization separated by dielectric material(s) may be formed on either one or both of the top side 240 or bottom side 250 of the substrate 210. Such a modified method may facilitate the formation of an increased density of TSVs on a TSV die as compared to a method including the formation of a single layer of metal lines on sides of a substrate. This modified method may result in the formation of a metal and dielectric layer stack on a substrate 210 as illustrated in FIG. 11, generally indicated at 600. FIG. 11 is an elevational view from the side of a portion of a diced substrate, similar to that of FIG. 4, but with multiple layers of metal lines 220 formed thereon and separated by layers of dielectric 610. The substrate 210 and metal lines 220 may be formed of similar materials as the substrate 210 and metal lines 220 described above. The dielectric 610 may be any suitable dielectric, for example, silicon dioxide or polyimide. The metal lines 220 may be deposited by methods such as those described above and the dielectric may be deposited by methods similar to those as for the encapsulent 410 described above. The layers of dielectric 610 may be planarized prior to the deposition of metal lines 220 thereupon. Various methods of depositing and patterning metal lines and dielectric layers are known in the art of semiconductor fabrication and will not be described in further detail here.

FIG. 11 illustrates three layers of metal lines 220 and dielectric 610 deposited on both the top side 240 and bottom side 250 of the substrate 210. Various aspects may, however, have a greater or lesser number of layers of dielectric 610 and metal lines 220, for example, four, five, six, or more layers of dielectric 610 and metal lines 220. Further, in some aspects, only one of the top side 240 and bottom side 250 of the substrate 210 may have layers of dielectric 610 and/or metal lines 220 formed thereon. The metal lines 220 may have a similar pattern in each layer, may have a pattern that is similar but offset from one layer to another, or may have different patterns in different layers.

Upon formation of the multiple layers of metal lines 220 and dielectric 610, the diced substrate 600 may be processed in accordance with steps such as steps 140-180 of FIG. 1 described above to form TSVs in a reconstituted wafer or multi-layer module to form an electrical device.

Figure 12:
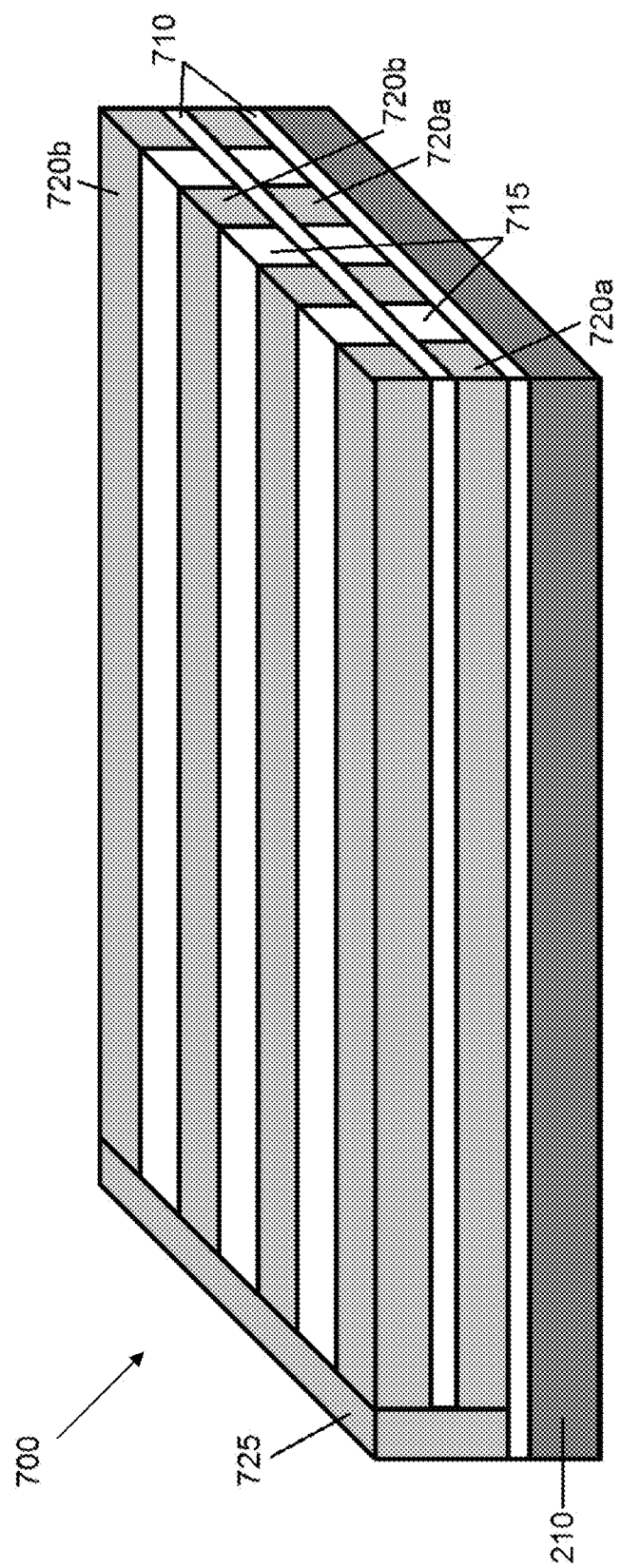
FIG. 12 is an isometric view of one example of a through substrate via die in accordance with aspects of the present invention.
Figure 13:
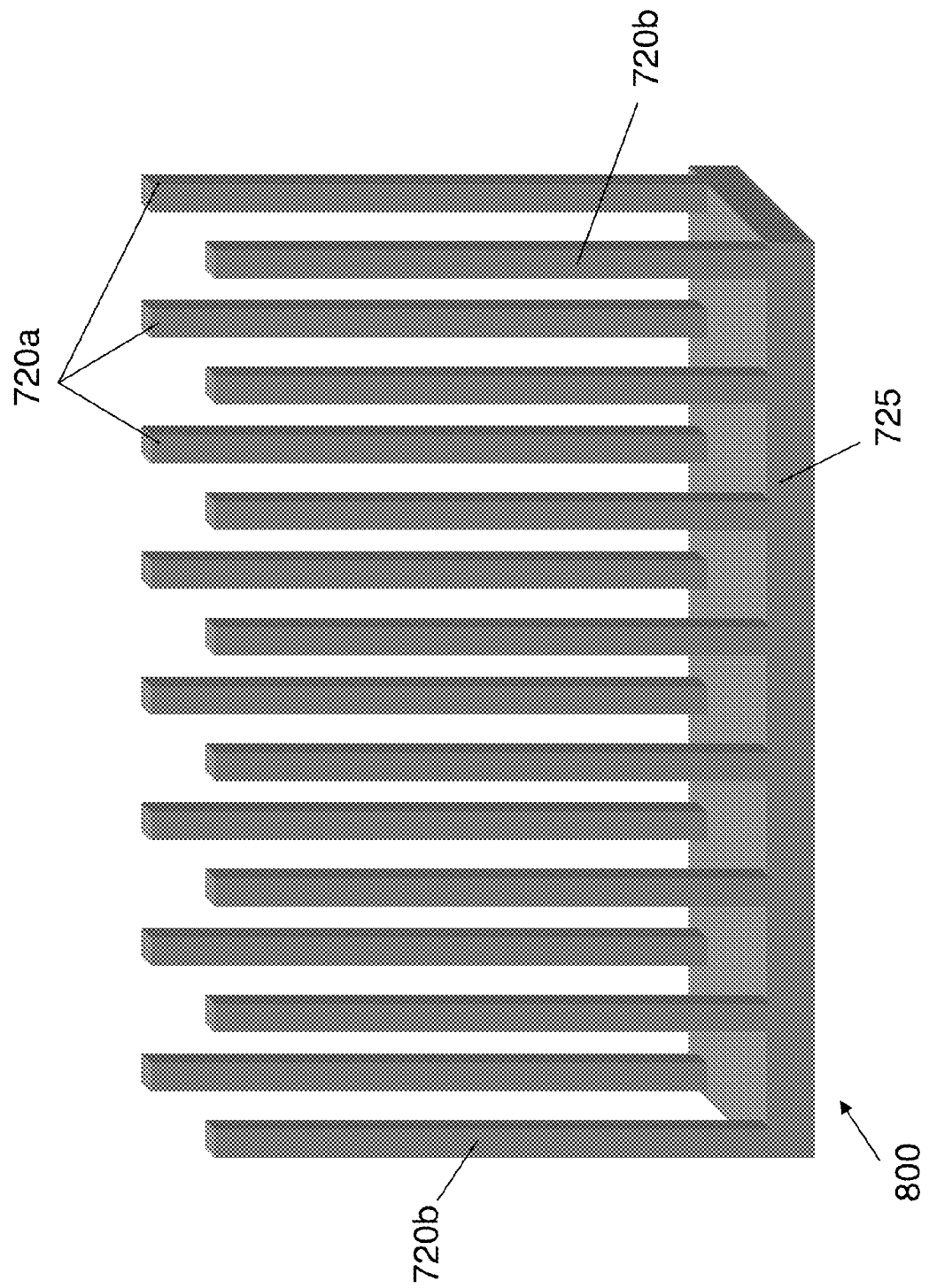
FIG. 13 is an isometric view of one example of a through substrate via structure in accordance with aspects of the present invention.
Figure 14:
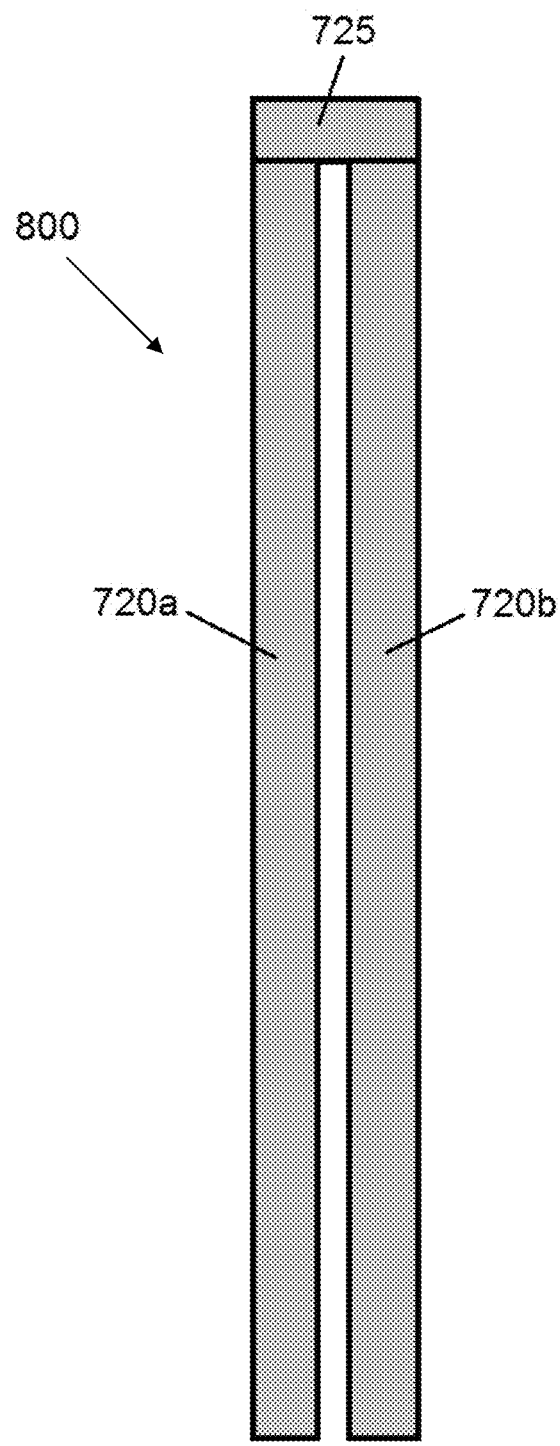
FIG. 14 is a plan view of one example of a through substrate via structure in accordance with aspects of the present invention.
Figure 15:
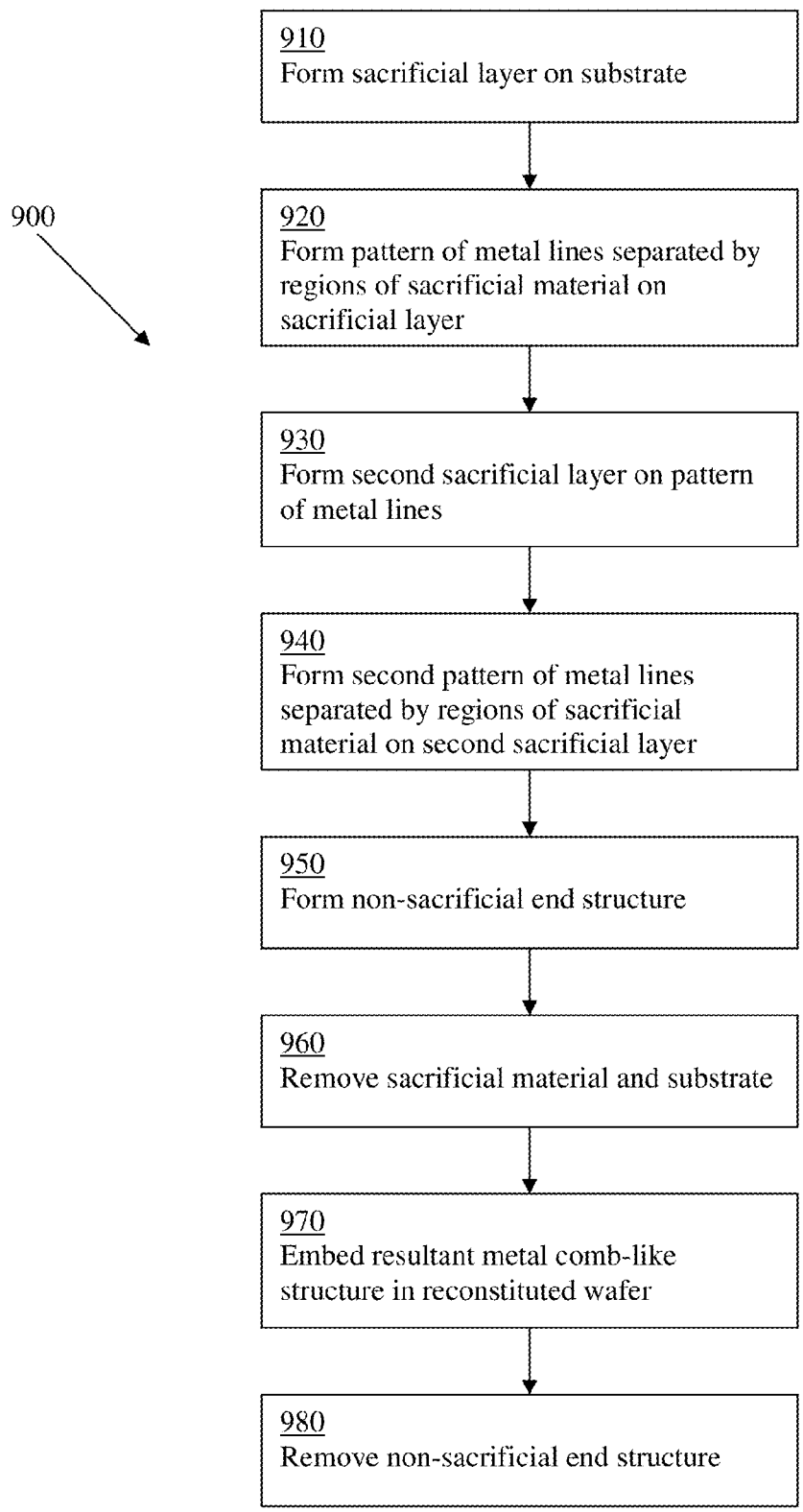
FIG. 15 is a flow chart of one example of a method in accordance with aspects of the present invention.

A further aspect of the present invention is illustrated in FIGS. 12-14. A flowchart of an example of a method for forming the aspect of FIGS. 12-14 is illustrated in FIG. 15, indicated generally at 900. In this aspect, a first sacrificial material layer 710 is formed on a substrate 210 (step 910 of FIG. 15.) The substrate 210 may comprise any one or more of the substrate materials discussed above. The sacrificial material layer 710 may comprise a polymer such as polyimide, a dielectric such as glass, a metal such as copper, or any other material that may later be removed as described below. A first pattern of metal lines 720a is formed on the sacrificial material layer 710 by any suitable method of deposition and patterning (step 920 of FIG. 15.) Between individual metal lines 720a are formed regions of sacrificial material 715, which in some embodiments may be the same or a similar material as in the sacrificial material layer 710. A second sacrificial material layer 710, which may comprise the same material as the first sacrificial material layer 710, is formed atop the first pattern of metal lines 720a and sacrificial material 715 (step 930 of FIG. 15.) A second pattern of metal lines 720b, separated by sacrificial material 715 is then formed on the second sacrificial material layer 710 by any suitable method of deposition and patterning (step 940 of FIG. 15.) The second pattern of metal lines 720b may be formed from the same or a similar material as the first pattern of metal lines 720a. A non-sacrificial end structure 725, which may comprise the same or a similar material as one or both of the first and second patterns of metal lines, 720a and 720b is formed along with the layers of metal lines and sacrificial material (step 950 of FIG. 15.) The non-sacrificial end structure 725 physically bonds with or is formed integral with the first and second patterns of metal lines, 720a and 720b.

Although only two layers of metal lines and four metal lines in each layer are illustrated in FIG. 12, it should be understood that multiple additional layers of metal lines, for example, six or more, and additional metal lines in each layer, for example, 10 or more may be included in various aspects.

Methods of deposition and patterning of the various layers and regions of sacrificial material, metal lines, and other features of the aspect of FIGS. 12-14 may be similar to those methods described above with reference to other aspects or may be any appropriate methods known in the art of semiconductor fabrication.

The structure of FIG. 12 may be placed in a solution, for example, a solvent, acid, or other appropriate solution to dissolve or otherwise remove the sacrificial material layers 710 and sacrificial material 715 (step 960 of FIG. 15.) The substrate 210 may then be removed, leaving behind a metal comb-like structure 800 as illustrated in isometric view in FIG. 13, and in plan view in FIG. 14. The structure 800 includes a row of a plurality of metal posts formed by the metal lines 720a and a row of a plurality of metal posts formed by the metal lines 720b, all connected to one another by the non-sacrificial end structure 725. The metal posts formed by the metal lines 720a and 720b are illustrated wider in FIG. 14 than in FIG. 13.

The structure 800 may be incorporated or embedded into a reconstituted wafer or multichip module and encapsulated (step 970 of FIG. 15.) The structure 800 may be oriented with the long axes (the axes in the vertical direction in FIG. 14) of the metal posts normal to a surface of the reconstituted wafer or multi-chip module in which it is embedded. After the reconstituted wafer or multichip module is formed, the non-sacrificial end structure 725 may be removed by, for example, thinning of the reconstituted wafer or multi-chip module (step 980 of FIG. 15.) The metal posts may function as TSVs in the reconstituted wafer or multi-chip module.

The materials of construction and dimensions of the structures illustrated in the aspect of FIGS. 12 and 13 are not limited to any particular materials or dimensions. In one specific embodiment, the metal lines 720a and/or 720b may comprise a nickel-cobalt alloy or a copper core enclosed in another material such as a nickel-cobalt alloy. The sacrificial material 715 and/or sacrificial material layers 710 may comprise copper. The metal posts formed from the metal lines 720a and/or 720b may have dimensions of from about 500 µm to about one mm or more in length with a cross sectional area of between about 25 µm$^2$ and about 100 µm$^2$.

In various embodiments, one or more of the steps of the methods illustrated in FIG. 1 or FIG. 15 or as described above with reference to the formation of inductors or TSV die may be performed in a different order than illustrated or described. In some embodiments, one or more of the steps illustrated in FIG. 1 or FIG. 15 may be eliminated and/or additional steps may be included in the method or substituted for one or more of the acts illustrated. For example, in some embodiments of the method of FIG. 1, following metallization of the top and/or bottom sides 240 and 250 of the substrate and dicing, one or more die are placed along with other components and encapsulated to form a reconstituted wafer with multi-chip modules. The reconstituted wafer may then have at least one layer of metal patterned on the top and/or bottom surfaces thereof that connect to the exposed metallization on the diced surfaces of the die. The top and/or bottom metallization of the die (acts 160 and/or 180 of FIG. 1) may be performed concurrently with the formation of interconnects of the multi-chip modules. The finished wafer may be diced to produce modules with the die embedded in the modules. The embedded die can provide electrical connection between the top and bottom surfaces of the modules (TSVs) or they can be functional components of the modules, for example, inductors.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of forming an electrical component, the method comprising:
   selecting a substrate;
   forming a pattern of a first conductive material on a top surface of the substrate;
   forming a pattern of a second conductive material on one of a bottom surface of the substrate and a dielectric layer formed over the pattern of the first conductive material;
   dicing the substrate into a plurality of dies each having a first diced surface and a second diced surface, the first diced surface and the second diced surface formed by the dicing of the substrate;
   securing the first diced surface of each of the plurality of dies to a retaining material;
   encapsulating the plurality of dies in an encapsulent to form a reconstituted wafer; and
   forming a pattern of a third conductive material on the second diced surfaces by metalizing a surface of the reconstituted wafer.

2. The method of claim 1, wherein each of the first conductive material, the second conductive material, and the third conductive material comprise a metal.

3. The method of claim 2, wherein forming the pattern of a first conductive material on the top surface of the substrate comprises forming a first plurality of metal lines on the top surface of the substrate.

4. The method of claim 3, wherein forming the pattern of the second conductive material on the bottom surface of the substrate comprises forming a second plurality of metal lines on the bottom surface of the substrate.

5. The method of claim 4, wherein forming the second plurality of metal lines on the bottom surface of the substrate comprises forming the second plurality of metal lines at positions horizontally displaced from the first plurality of metal lines on the top surface of the substrate.

6. The method of claim 5, wherein selecting a substrate comprises selecting a substrate comprising a ferrite material.

7. The method of claim 6, further comprising forming a pattern of a fourth conductive material on the first diced surfaces.

8. The method of claim 7, further comprising thinning the reconstituted wafer prior to one of forming the pattern of the third conductive material on the second diced surface and forming the pattern of the fourth conductive material on the first diced surface.

9. The method of claim 6, wherein forming the pattern of the third conductive material on the second diced surface electrically connects a first metal line on the top side of the substrate to a second metal line on the bottom side of the substrate.

10. The method of claim 9, wherein forming the pattern of the fourth conductive material on the first diced surface electrically connects a fourth metal line on the top side of the substrate to the second metal line on the bottom side of the substrate.

11. The method of claim 10, wherein the electrical component formed comprises an inductor.

12. The method of claim 3, wherein selecting a substrate comprises selecting a substrate comprising an insulating material.

13. The method of claim 12, further comprising forming one or more bond pads in electrical communication with one or more of the first plurality of metal lines on a lower side of the reconstituted wafer.

14. The method of claim 13, further comprising thinning the reconstituted wafer prior to one of forming the one or more bond pads on the upper side of the reconstituted wafer and forming the one or more bond pads on the lower side of the reconstituted wafer.

15. The method of claim 12, further comprising forming one or more bond pads in electrical communication with one or more of the first plurality of metal lines on an upper side of the reconstituted wafer.

16. The method of claim 15, further comprising:
  incorporating the electrical component into an electronic module, one of the first plurality of metal lines configured as a through wafer via in the electronic module; and
  electrically connecting a second electronic component in the electronic module to the one of the first plurality of metal lines.

17. The method of claim 15, wherein the one or more of the first plurality of metal lines have a length in a direction normal to the first diced surface of greater than about 1 mm.

18. The method of claim 15, wherein the one or more of the first plurality of metal lines have a length which is greater than about 15 times a thickness of the one or more of the first plurality of metal lines and about 15 times a width of the one or more of the first plurality of metal lines.

19. A method of forming an electrical component, the method comprising:
  forming a first pattern of metal lines on a top surface of a substrate, each of the metal lines in the first pattern having a length;
  forming a second pattern of a metal lines one of a bottom surface of the substrate and a dielectric layer formed over the pattern of the first conductive material, the metal lines in the second pattern parallel to the metal lines in the first pattern;
  dicing the substrate into one or more die having a first diced surface and a second diced surface formed by the dicing of the substrate; and
  forming a third pattern of metal on the first diced surface;
  wherein forming the second pattern of a metal lines comprises forming the second pattern of metal lines horizontally displaced from the metal lines in the first pattern in a direction normal to a direction defined by the length of a metal line in the first pattern of metal lines and in a plane parallel to the bottom surface of the substrate.

20. The method of claim 19, wherein forming the third pattern of metal comprises forming a third pattern of metal lines.

21. The method of claim 20, further comprising forming a fourth pattern of metal lines on the second diced surface.

22. The method of claim 21, further comprising electrically connecting a metal line in the first pattern of metal lines and a metal line in the second pattern of metal lines with a metal line in one of the third pattern of metal lines and the fourth pattern of metal lines.

23. A method of forming an electrical component, the method comprising:
  selecting a substrate;
  forming a layer of first sacrificial material on a top surface of the substrate;
  forming a pattern of a first conductive material on a top surface of the layer of the first sacrificial material;
  forming a layer of second sacrificial material on a top surface of the pattern of the first conductive material;
  forming a pattern of a second conductive material on a top surface of the layer of the second sacrificial material;
  forming an end structure physically joined to at least a portion of the pattern of the first conductive material and to at least a portion of the pattern of the second conductive material;
  removing the substrate and the layer of the first sacrificial material from the pattern of the first conductive material;
  embedding the pattern of the first conductive material and the pattern of the second conductive material in one of a reconstituted wafer and a multi-chip module; and
  removing the end structure from the embedded pattern of the first conductive material and pattern of the second conductive material.

24. The method of claim 1, wherein a plane defined by the first diced surface and a plane defined by the second diced surface are substantially perpendicular to a plane defined by the top surface and a plane defined by the bottom surface.

* * * * *